US011539446B2

(12) United States Patent
Nakayama

(10) Patent No.: US 11,539,446 B2
(45) Date of Patent: Dec. 27, 2022

(54) OPTICAL RECEIVER

(71) Applicant: SUMITOMO ELECTRIC INDUSTRIES, LTD., Osaka (JP)

(72) Inventor: Kenichi Nakayama, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 293 days.

(21) Appl. No.: 17/015,936

(22) Filed: Sep. 9, 2020

(65) Prior Publication Data

US 2021/0083780 A1 Mar. 18, 2021

(30) Foreign Application Priority Data

Sep. 12, 2019 (JP) .............................. JP2019-166261

(51) Int. Cl.
| | |
|---|---|
| *H04B 10/00* | (2013.01) |
| *H04B 10/69* | (2013.01) |
| *H05K 1/02* | (2006.01) |
| *H05K 1/18* | (2006.01) |
| *H05K 1/11* | (2006.01) |

(52) U.S. Cl.
CPC ......... *H04B 10/691* (2013.01); *H05K 1/0216* (2013.01); *H05K 1/111* (2013.01); *H05K 1/181* (2013.01); *H05K 2201/10015* (2013.01); *H05K 2201/10151* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,880,657 | A * | 3/1999 | Dorschky | H01P 3/081 333/33 |
| 6,754,406 | B2 * | 6/2004 | Kaneshiro | G02B 6/4249 385/91 |
| 8,891,975 | B2 * | 11/2014 | Yagisawa | H04B 10/801 398/214 |
| 9,172,335 | B2 * | 10/2015 | Ueno | H04B 10/60 |
| 9,444,552 | B2 * | 9/2016 | Yagisawa | H03F 3/08 |
| 9,477,038 | B2 * | 10/2016 | Yu | G02B 6/428 |
| 9,780,141 | B2 * | 10/2017 | Daikuhara | H01L 27/14683 |
| 9,893,810 | B2 * | 2/2018 | Lee | G02B 6/4279 |
| 9,971,113 | B2 * | 5/2018 | Hara | G02B 6/4214 |
| 9,998,234 | B2 * | 6/2018 | Kaikkonen | H04B 10/697 |

(Continued)

FOREIGN PATENT DOCUMENTS

JP 2017-135194 8/2017

*Primary Examiner* — Agustin Bello
(74) *Attorney, Agent, or Firm* — Smith, Gambrell & Russell, LLP.

(57) ABSTRACT

Disclosed is an optical receiver. The optical receiver includes a circuit board, a base member, a photodetector mounted on the base member, a transimpedance amplifier, and a capacitor. The base member is disposed between a first grounding pattern and a second grounding pattern on a first side of the circuit board. The transimpedance amplifier is mounted on the first grounding pattern. The capacitor is mounted on the second grounding pattern. The first wiring pattern and the second wiring pattern are apart from both the first grounding pattern and the second grounding pattern in a plan view of the first side. The first grounding pattern is electrically connected to the second grounding pattern through a grounding pattern formed on the first side.

10 Claims, 11 Drawing Sheets

(56) References Cited

U.S. PATENT DOCUMENTS

| | | | | |
|---|---|---|---|---|
| 10,135,545 | B2* | 11/2018 | Ban | H01L 31/02005 |
| 10,250,334 | B2* | 4/2019 | Ban | H04B 10/80 |
| 10,263,709 | B2* | 4/2019 | Yagisawa | G02B 6/40 |
| 11,012,042 | B2* | 5/2021 | Nakayama | H03F 3/08 |
| 2008/0226222 | A1* | 9/2008 | Kim | G02B 6/423 |
| | | | | 427/163.2 |
| 2010/0025843 | A1* | 2/2010 | Iwaida | H01S 5/02212 |
| | | | | 257/693 |
| 2011/0052205 | A1* | 3/2011 | Yu | H04B 10/801 |
| | | | | 398/142 |
| 2012/0070121 | A1* | 3/2012 | Ito | H03F 3/087 |
| | | | | 385/88 |
| 2012/0170944 | A1* | 7/2012 | Yagisawa | H04B 10/801 |
| | | | | 398/214 |
| 2013/0209027 | A1* | 8/2013 | Yu | G02B 6/43 |
| | | | | 385/14 |
| 2015/0016222 | A1* | 1/2015 | Kandori | G01S 15/02 |
| | | | | 367/87 |
| 2015/0063832 | A1* | 3/2015 | Park | G02B 6/4274 |
| | | | | 398/214 |
| 2015/0069220 | A1* | 3/2015 | Yagisawa | H04B 10/60 |
| | | | | 250/214 A |
| 2015/0270814 | A1* | 9/2015 | Ban | H03F 3/08 |
| | | | | 250/214 A |
| 2015/0365176 | A1* | 12/2015 | Kawamura | G02B 6/423 |
| | | | | 29/825 |
| 2016/0149643 | A1* | 5/2016 | Kasai | H04J 14/0256 |
| | | | | 398/79 |
| 2016/0170145 | A1* | 6/2016 | Kawamura | G02B 6/4249 |
| | | | | 250/226 |
| 2016/0336368 | A1* | 11/2016 | Lee | H04B 10/25891 |
| 2017/0212320 | A1* | 7/2017 | Hara | G02B 6/4245 |
| 2017/0366277 | A1* | 12/2017 | Ban | H04B 10/697 |
| 2018/0149818 | A1* | 5/2018 | Yamauchi | H01S 5/02251 |
| 2018/0175113 | A1* | 6/2018 | Furuya | H01L 23/48 |
| 2018/0269986 | A1* | 9/2018 | Ban | H04B 10/80 |
| 2019/0312652 | A1* | 10/2019 | Shiraishi | H04B 10/693 |
| 2019/0319594 | A1* | 10/2019 | Nakayama | H03F 3/45475 |
| 2019/0377143 | A1* | 12/2019 | Tsuchiyama | G02B 6/421 |
| 2021/0083780 | A1* | 3/2021 | Nakayama | H05K 1/181 |

* cited by examiner

OPTICAL RECEIVER

CROSS-REFERENCE TO RELATED APPLICATIONS

This application is based upon and claims the benefit of priority from Japanese Patent Application No. 2019-166261, filed on 12 Sep. 2019, the entire contents of which are incorporated herein by reference.

TECHNICAL FIELD

The present disclosure relates to an optical receiver.

BACKGROUND

Japanese Unexamined Patent Publication No. 2017-135194 discloses an optical receiving module including a photodetector and a transimpedance amplifier. In an optical receiver, an electric signal output from a photodetector, for example, a current signal is amplified by a transimpedance amplifier (TIA). In this case, as shown in FIG. 10, a photodetector 101 may be mounted on a base member 102 having a wiring pattern, and the wiring pattern on the base member 102 and a TIA 103 may be connected through a bonding wire 104. However, such a configuration has the following problems. That is, a parasitic capacitance is generated between the wiring pattern on the base member 102 and a conductor 105 under the base member 102. With a recent increase in a speed of optical communication, a frequency of optical signals is increasing, and a frequency band of, for example, several tens of GHz is being used. In such a frequency band, when there is a resonance frequency due to the above-described parasitic capacitance and an inductance of the bonding wire 104, a non-transmission band of an electric signal is generated. As a result, there is a risk of deterioration of communication quality such as deterioration of a signal waveform and a crosstalk between channels.

SUMMARY

The present disclosure provides an optical receiver. The optical receiver includes a circuit board, a base member, a photodetector, a transimpedance amplifier, and a capacitor. The circuit board has a first side, a second side opposite to the first side, a first grounding pattern and a second grounding pattern which are formed on the first side separately from each other, and a signal line which is formed on the first side. The base member has an insulating body, and a first wiring pattern and a second wiring pattern which are formed on a third side of the insulating body. The base member is disposed between the first grounding pattern and the second grounding pattern on the first side. The photodetector has a first electrode and a second electrode and is mounted on the third side. The first electrode is electrically connected to the first wiring pattern, and the second electrode is electrically connected to the second wiring pattern. The transimpedance amplifier has a fourth side, and a first pad and a second pad which are formed on the fourth side. The transimpedance amplifier is mounted on the first grounding pattern. The first pad is electrically connected to the signal line through a first wire. The second pad is electrically connected to the first wiring pattern through a second wire. The capacitor has a third electrode and a fourth electrode and is mounted on the second grounding pattern. The third electrode is electrically connected to the second wiring pattern. The fourth electrode is electrically connected to the second grounding pattern. The first wiring pattern and the second wiring pattern are apart from both the first grounding pattern and the second grounding pattern in a plan view of the first side. The first grounding pattern is electrically connected to the second grounding pattern through at least one of a third grounding pattern and a fourth grounding pattern. The third grounding pattern is formed on the first side and is apart from the first wiring pattern and the second wiring pattern in the plan view of the first side. The fourth grounding pattern is formed at least in an inside of the circuit board or on the second side of the circuit board.

DETAILED DESCRIPTION

Figure 1:
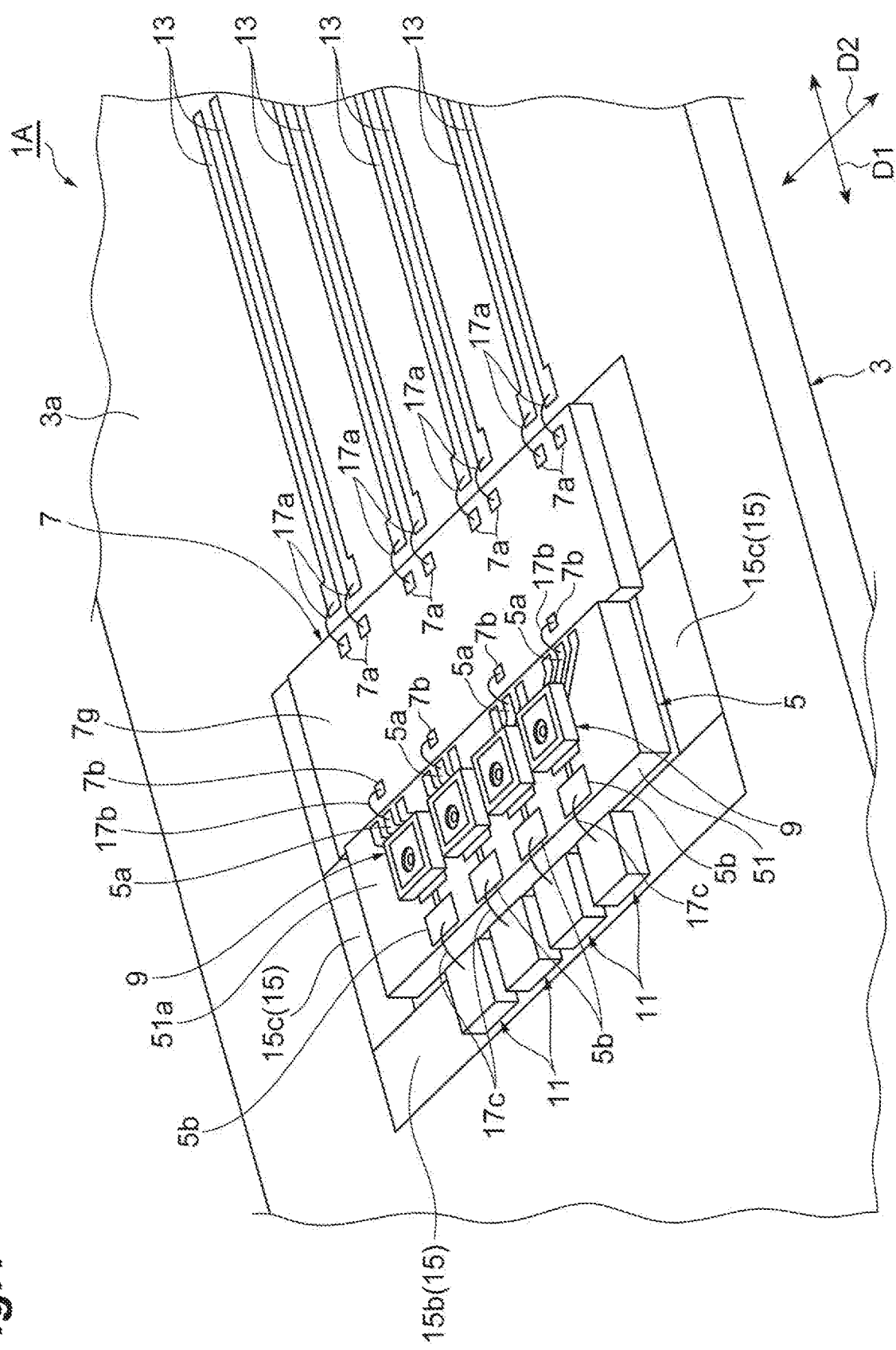
FIG. 1 is a perspective view showing a configuration of an optical receiver according to an embodiment.

Specific examples of an optical receiver of the present disclosure will be described below with reference to the drawings. The present invention is not limited to these examples but is defined by the scope of claims and is intended to include meanings equivalent to the scope of claims and all modifications within the scope. In the following description, the same reference numerals are given to the same elements in the description of the drawings, and a duplicate description will be omitted.

Figure 2:
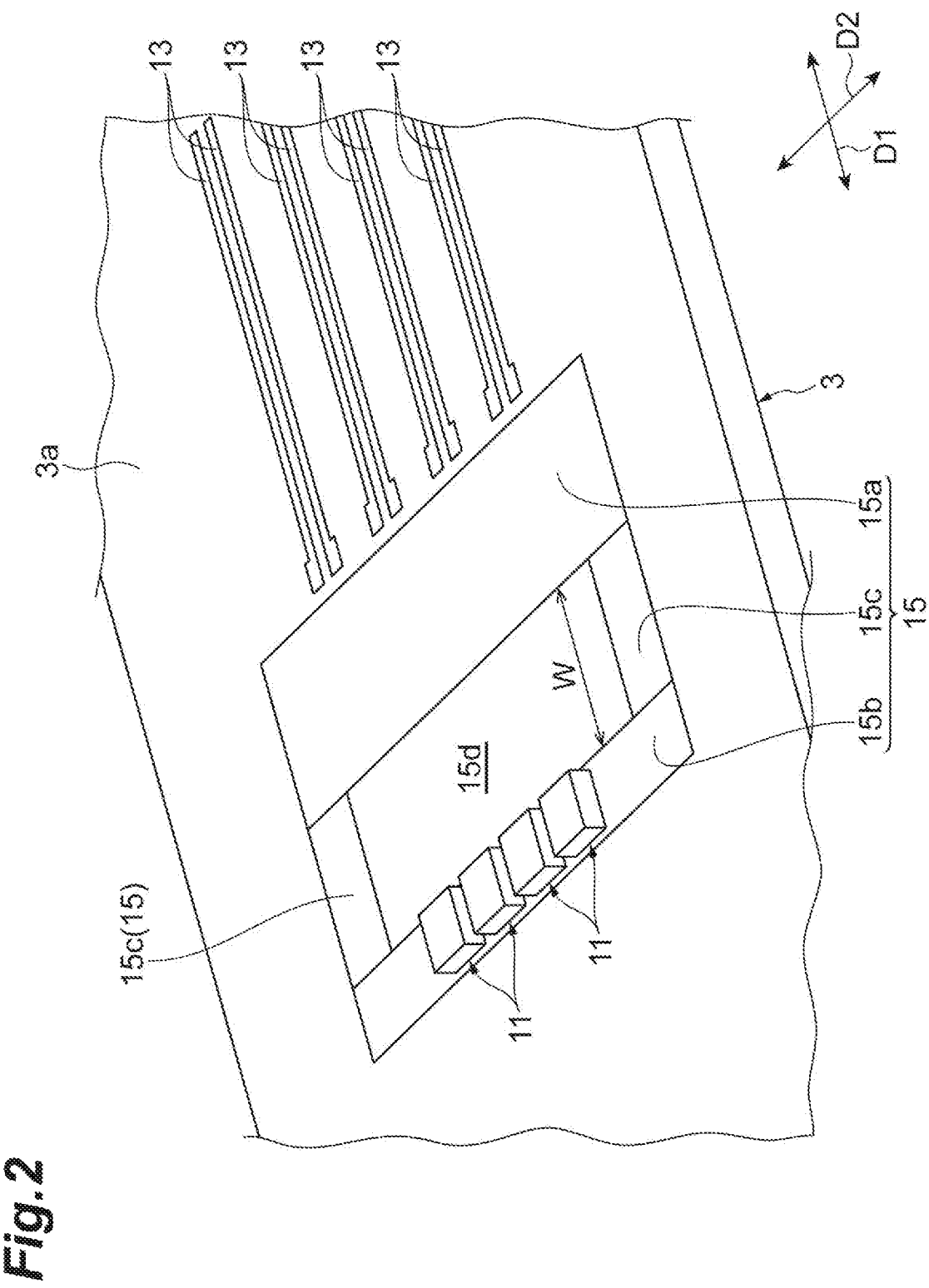
FIG. 2 is a perspective view showing a surface of a printed circuit board with a base member and a TIA removed.
Figure 3:
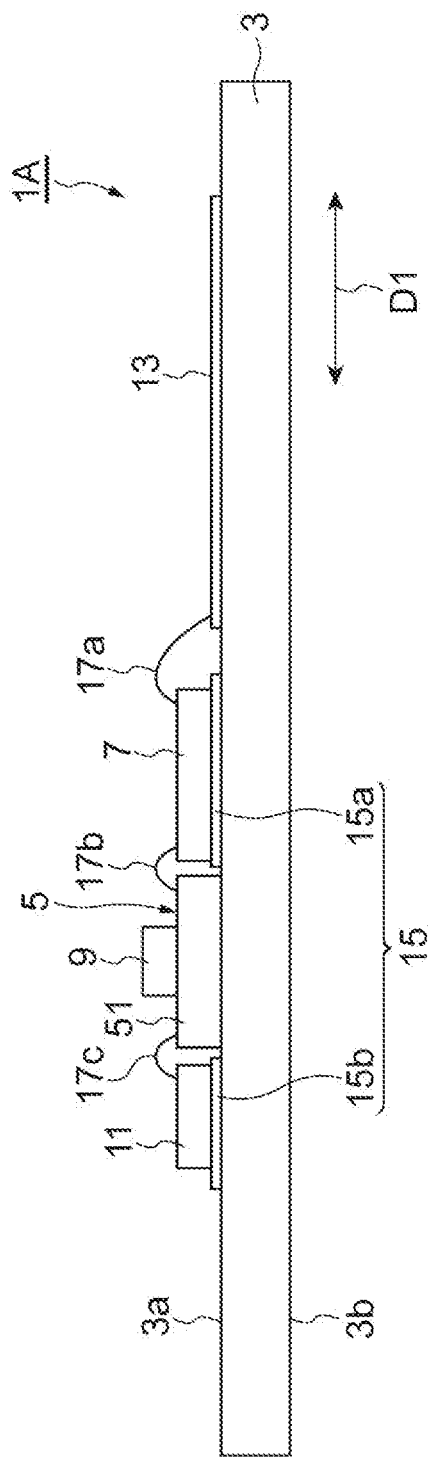
FIG. 3A is a diagram schematically showing a cross section of the optical receiver in a first direction.
FIG. 3B is an enlarged view of a part of FIG. 3A.

FIG. 1 is a perspective view showing a configuration of an optical receiver 1A according to an embodiment. FIG. 2 is a perspective view showing a surface 3a of a printed circuit board 3 with a base member 5 and a TIA 7 removed. FIG. 3A is a diagram schematically showing a cross section of the optical receiver 1A in a first direction D1. FIG. 3B is an enlarged view of a part of FIG. 3A. The optical receiver 1A is a chip-on-board (COB) mounting type optical receiver for smoothly performing 53 GBaud PAM4 signal transmission used in 100 G/λ, transmission, for example. The 100 G/λ, transmission is a method of performing 100 Gbps signal transmission by an optical signal having one peak wavelength.

As shown in FIGS. 1, 2, 3A and 3B, the optical receiver 1A includes the printed circuit board (PCB) 3, the base member 5, the TIA 7, N photodetectors 9, N capacitors 11, N sets of signal lines 13, and a grounding pattern 15. N is an integer of 1 or more, and in one example, N is 4.

The printed circuit board 3 is, for example, a rigid multilayer printed circuit board having a flat surface 3a and a back surface 3b opposite to the surface 3a. The surface 3a is an example of a first side in the present disclosure. The back surface 3b is an example of a second side in the present disclosure. The printed circuit board 3 includes, for example, a plurality of laminated insulating layers, a conductive wiring pattern formed between the layers, and a conductive wiring pattern formed on the surface 3a. A material of the insulating layer is FR4, for example. FR4 is a glass fiber cloth impregnated with an epoxy resin and subjected to a heat curing treatment. A material of the wiring pattern is, for example, Au or Cu. A flat shape of the printed circuit board 3 is, for example, a substantially rectangular shape. The printed circuit board 3 has a grounding pattern 15 and N sets of signal lines 13 on the surface 3a. In the shown example, N is 4. The signal line 13 and the grounding pattern 15 are metal films formed on the surface 3a and are formed of, for example, Au or Cu. The grounding pattern 15 has a reference potential of an electric signal transmitted by the signal line 13. The grounding pattern is grounded, for example.

As shown in FIG. 2, the grounding pattern 15 includes a first region 15a, a second region 15b, and a third region 15c. The first region 15a is an example of the first grounding pattern in the present disclosure. The second region 15b is an example of the second grounding pattern in the present disclosure. The third region 15c is an example of the third grounding pattern in the present disclosure. The first region 15a is a rectangular region of which a longitudinal direction is a second direction D2 which intersects the first direction D1. The second direction D2 is, for example, orthogonal to the first direction D1. A TIA 7 which will be described later is mounted in the first region 15a. In a plan view in a thickness direction of the printed circuit board 3, that is, in a normal direction of the surface 3a, the first region 15a has an area and a shape having a size including the TIA 7. The second region 15b is a rectangular region of which a longitudinal direction is the second direction D2. The second region 15b is provided to be arranged along with the first region 15a at an interval W in the first direction D1. That is, the first region 15a and the second region 15b are formed to be separated from each other in the first direction D1. The N capacitors 11 which will be described later are mounted on the second region 15b. In the plan view in the thickness direction of the printed circuit board 3, the second region 15b has an area and a shape having a size which collectively includes the N capacitors 11.

The surface 3a of the printed circuit board 3 is exposed through a gap between the first region 15a and the second region 15b. The base member 5 which will be described later is disposed on the exposed surface 3a. The gap W between the first region 15a and the second region 15b is larger than a width of the base member 5 in the first direction D1. Therefore, the base member 5 and the first region 15a and the second region 15b are separated from each other in a plan view in a normal direction of the surface 3a.

The first region 15a is electrically connected to the second region 15b through a wiring provided on the surface 3a of the printed circuit board 3. In the embodiment, the grounding pattern 15 includes a pair of third regions 15c, and the first region 15a is electrically connected to the second region 15b through the pair of third regions 15c. The third regions 15c are arranged and disposed to pass laterally along the base member 5 and are separated from the base member 5 in the plan view in the normal direction of the surface 3a. That is, when the printed circuit board 3 is seen in a plan view from the surface 3a side, one third region 15c extends from the first region 15a along one side surface of the base member 5 in the first direction D1 and reaches the second region 15b. The other third region 15c extends from the first region 15a along the other side surface of the base member 5 in the first direction D1 and reaches the second region 15b. Therefore, the grounding pattern 15 has an opening 15d formed by the first region 15a, the second region 15b, and the pair of third regions 15c. The opening 15d does not include any wiring patterns on the surface 3a including the grounding pattern 15 and the signal line 13. The base member 5 is disposed to cover the opening 15d. In other words, the opening 15d surrounds the periphery of the base member 5 in the plan view in the normal direction of the surface 3a of the printed circuit board 3. The first region 15a and the second region 15b may be electrically connected to each other through a wiring provided inside the printed circuit board 3 and may be electrically connected to each other through both the wiring and the third regions 15c.

The N sets of signal lines 13 are provided on the side opposite to the opening 15d with respect to the first region 15a and each has an elongated shape which extends in the first direction D1. When N is 2 or more, the N sets of signal lines 13 are arranged and disposed in the second direction D2 along an edge of the first region 15a. A pad for wire bonding is formed at one end of each of the signal lines 13 on the first region 15a side. Each of the sets of signal lines 13 has a pair of wiring patterns which extend parallel to each other in the first direction D1. Each of the sets of signal lines 13 transmits a differential signal.

The base member 5 is a plate-shaped member on which N photodetectors 9 are mounted and is disposed between the first region 15a and the second region 15b of the grounding pattern 15. The base member 5 has an insulating body 51. A material of the insulating body 51 is, for example, quartz. The insulating body 51 has, for example, an exterior such as a substantially rectangular parallelepiped shape and includes a rectangular flat surface 51a and a pair of side surfaces 51b and 51c of which a normal direction is the first direction D1. The surface 51a is an example of a third side in the present disclosure. A longitudinal direction of the surface 51a coincides with the second direction D2. The side surface 51b is directed to the first region 15a side and extends along the edge of the first region 15a. The side surface 51c is directed to the second region 15b side and extends along an edge of the second region 15b. A thickness of the base member 5 is equal to a thickness of the TIA 7 which will be described later. In other words, a height of the surface 51a with the surface 3a of the printed circuit board 3 as a reference surface, that is, a distance between the surface 3a and the surface 51a is equal to a height of an upper surface 7g of the TIA 7 with the surface 3a as a reference surface, that is, a distance between the surface 3a and the upper surface 7g.

The base member 5 further includes N first wiring patterns 5a and N second wiring patterns 5b which are metal films formed on the surface 51a of the insulating body 51. When N is 2 or more, the N first wiring patterns 5a are arranged in the longitudinal direction of the front surface 51a, that is, the second direction D2. When N is 2 or more, the N second wiring patterns 5b are arranged in the longitudinal direction of the surface 51a, that is, the second direction D2. A constituent material of the first wiring pattern 5a and the second wiring pattern 5b is, for example, Au or Cu.

As described above, the base member 5 is disposed to cover the opening 15d of the grounding pattern 15 in a plan view in the normal direction of the surface 3a. In other words, the base member 5 is disposed between the first region 15a and the second region 15b on the surface 3a of the printed circuit board 3. A shape of the opening 15d when seen in the normal direction of the surface 3a includes the first wiring pattern 5a and the second wiring pattern 5b. In other words, the first wiring pattern 5a, the second wiring pattern 5b, and the grounding pattern 15 are separated from each other in the plan view in the normal direction of the surface 3a. In the plan view in the normal direction of the surface 3a, a reference potential and other wiring patterns are not provided at all in a region of the surface 3a which overlaps the first wiring pattern 5a and the second wiring pattern 5b. However, the other wiring patterns on the base member 5 except the first wiring pattern 5a and the second wiring pattern 5b may overlap the grounding pattern 15. The back surface of the base member 5 is bonded to the printed circuit board 3 via an adhesive such as a non-conductive resin.

The N photodetectors 9 are semiconductor elements each of which receives a signal light and converts the signal light received by each into a current signal. Each of the photodetectors 9 is optically coupled to, for example, an optical demultiplexer (not shown) and receives a corresponding signal light among a plurality of signal lights output from the optical demultiplexer. The signal lights respectively have different peak wavelengths. The N photodetectors 9 are mounted on the surface 51a of the base member 5 with the surface opposite to the surface facing the base member 5 as a light receiving surface. The N photodetectors 9 are arranged on the front surface 51a in the longitudinal direction of the front surface 51a, that is, in the second direction D2. A first electrode of each of the photodetectors 9, for example, an anode electrode is electrically connected to the corresponding first wiring pattern 5a. A second electrode of each of the photodetectors 9, for example, a cathode electrode is electrically connected to the corresponding second wiring pattern 5b. The above-described current signal flows from the second electrode (cathode) toward the first electrode (anode) of each of the photodetectors 9.

The TIA 7 has, for example, a rectangular plate shape of which a longitudinal direction is the second direction D2, and is mounted on the first region 15a of the grounding pattern 15. Specifically, the TIA 7 has a pad which serves as a reference potential on a bottom surface thereof, and the pad and the first region 15a are conductively bonded via a conductive bonding material such as solder. The TIA 7 has an upper surface 7g on the side opposite to the bottom surface, and N sets of output signal pads 7a and N input signal pads 7b are provided on the upper surface 7g. The upper surface 7g is an example of a fourth side in the present disclosure. The output signal pad 7a is an example of a first pad in the present disclosure. The input signal pad 7b is an example of a second pad in the present disclosure. The TIA 7 converts the current signal input to each of the input signal pads 7b into a voltage signal and outputs the voltage signal from the corresponding set of the output signal pads 7a.

The N sets of output signal pads 7a are provided near an end edge of the TIA 7 on the signal line 13 side, and when N is 2 or more, they are arranged in the second direction D2 along the end edge. The N input signal pads 7b are provided near an end edge of the TIA 7 on the base member 5 side, and when N is 2 or more, they are arranged in the second direction D2 along the end edge. The N sets of output signal pads 7a are electrically connected to the corresponding signal lines 13 through first wires 17a which are bonding wires. That is, one end of the first wire 17a is bonded to the output signal pad 7a, and the other end of the first wire 17a is bonded to the signal line 13. A height difference between a surface height of the output signal pad 7a from the surface 3a of the printed circuit board 3 as a reference surface and a surface height of the signal line 13 from the surface 3a as a reference surface, that is, a thickness of the TIA 7 is, for example, in a range of 0.15 mm to 0.25 mm. The N input signal pads 7b are electrically connected to the corresponding first wiring patterns 5a through the second wires 17b which are bonding wires. That is, one end of the second wire 17b is bonded to the input signal pad 7b, and the other end of the second wire 17b is bonded to the first wiring pattern 5a.

The capacitor 11 is a capacitive element such as a chip capacitor. N capacitors 11 are mounted on the second region 15b of the grounding pattern 15, and when N is 2 or more, the N capacitors 11 are arranged in the second region 15b in the second direction D2. Each of the capacitors 11 is disposed on the side opposite to the TIA 7 with the corresponding photodetectors 9 interposed therebetween in the first direction D1. In other words, the photodetectors 9 is disposed between the N capacitors 11 and the TIA 7 in the plan view in the normal direction of the front surface 3a of the printed circuit board 3.

Figure 4:
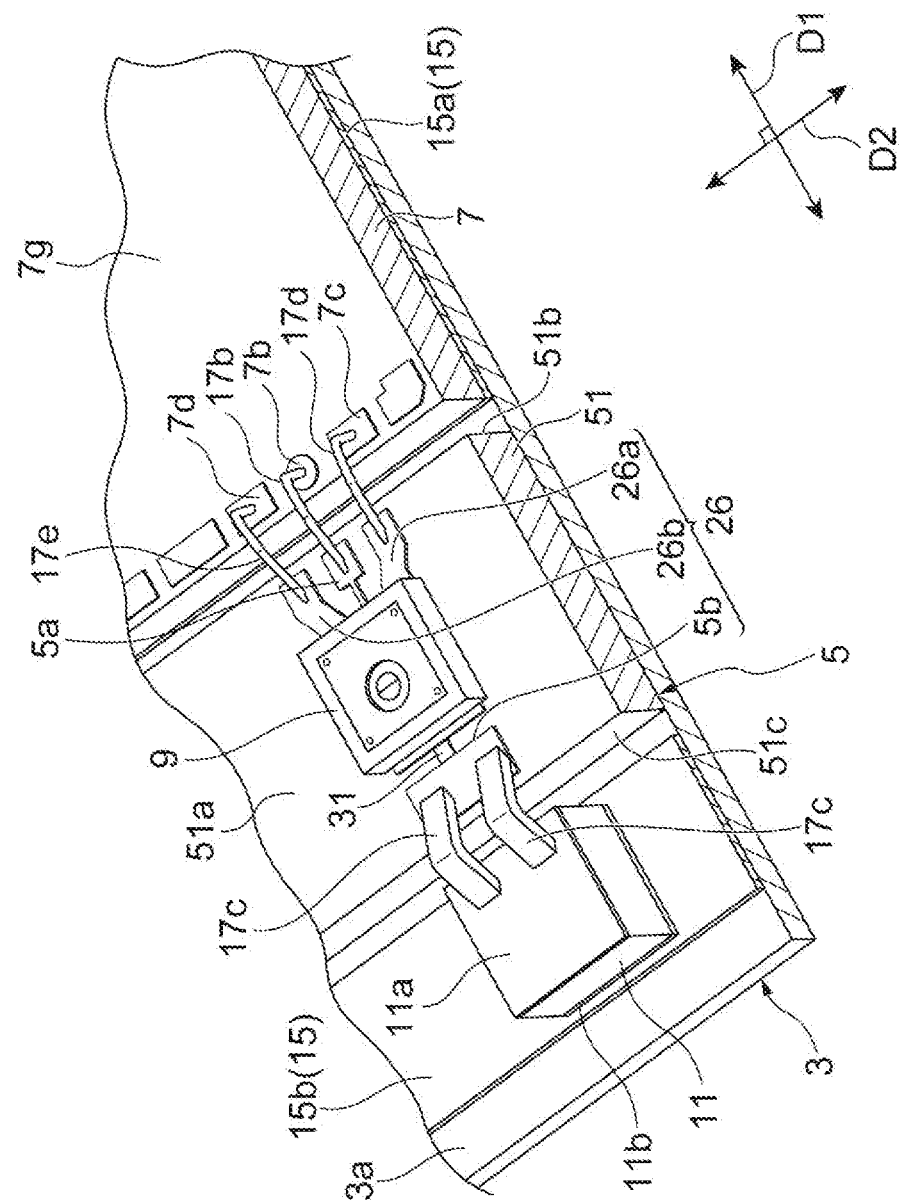
FIG. 4 is a cutaway perspective view showing an enlarged surrounding structure of a capacitor.

FIG. 4 is a cutaway perspective view showing an enlarged surrounding structure of one capacitor 11. For convenience, in FIG. 4, only a portion of the base member 5 which corresponds to one photodetector 9 and one capacitor 11 is shown, but the surrounding structures of the other capacitors 11 are the same as that in FIG. 4.

A conductive film 26 is provided on the surface 51a of the base member 5. The conductive film 26 is a metal film fixed to the surface 51a. The conductive film 26 includes the above-described second wiring pattern 5b. The conductive film 26 is conductively bonded to the cathode electrode provided on the back surface of the photodetector 9, that is, the surface on the side opposite to the light receiving surface, via a conductive bonding material such as solder. The conductive film 26 includes a portion located directly below the photodetector 9, a pair of portions 26a and 26b which extend from the photodetector 9 toward the TIA 7, and the second wiring pattern 5b which extends from the photodetector 9 toward the capacitor 11.

The portion 26a of the conductive film 26 is electrically connected to a bias pad 7c of the TIA 7 through the bonding wire 17d, for example. Similarly, the portion 26b of the conductive film 26 is electrically connected to a bias pad 7d of the TIA 7 through the bonding wire 17e. The conductive film 26 is supplied with a power supply voltage required for an operation of the photodetector 9, that is, a bias voltage, from the bias pads 7c and 7d of the TIA 7 through the bonding wires 17d and 17e.

A capacitance value of the capacitor 11 is larger than a capacitance value of the parasitic capacitance generated in the conductive film 26. In one example, the capacitance value of the capacitor 11 is 1 pF or more. The capacitor 11 has a pair of end surfaces arranged in the normal direction of the surface 3a of the printed circuit board 3. One electrode 11a is formed on one end surface, and the other electrode 11b is formed on the other end surface. The electrode 11a is an example of a third electrode in the present disclosure. The electrode 11b is an example of a fourth electrode in the present disclosure. The one electrode 11a of the capacitor 11 is electrically connected to the corresponding second wiring pattern 5b through the third wire 17c which is a bonding wire. That is, one end of the third wire 17c is bonded to the one electrode 11a of the capacitor 11, and the other end of the third wire 17c is bonded to the second wiring pattern 5b. The third wire 17c may be, for example, a ribbon wire. The number of the third wires 17c for one capacitor 11 is not limited to one, and a plurality of third wires 17c may be provided. A total inductance of all the third wires 17c connected to one capacitor 11 is smaller than a total inductance of the wires 17d and 17e. Therefore, when a constituent material of the third wire 17c is the same as a constituent material of the wires 17d and 17e, for example, a thicker wire than the wires 17d and 17e is used as the third wire 17c. A resistor element or a resistor 31 may be provided between the cathode of the photodetector 9 and the third wire 17c, for example, between a portion of the conductive film 26 connected to the cathode of the photodetector 9 and the second wiring pattern 5b.

The other electrode 11b of the capacitor 11 is electrically connected to the second region 15b of the grounding pattern 15. Specifically, the other electrode 11b of each of the capacitors 11 is conductively bonded to the second region 15b via a conductive bonding material such as solder.

The first wiring pattern 5a is a metal film fixed to the surface 51a and is conductively bonded to an anode electrode provided on the back surface of the photodetector 9 via a conductive bonding material such as solder. The first wiring pattern 5a extends from directly below the photodetector 9 toward the TIA 7. The first wiring pattern 5a is electrically connected to the input signal pad 7b of the TIA 7 through the second wire 17b. That is, one end of the second wire 17b is bonded to the first wiring pattern 5a, and the other end of the second wire 17b is bonded to the input signal pad 7b of the TIA 7. When a bias voltage is applied to the cathode electrode, a current signal generated in the photodetector 9 according to an incident light amount of the signal light is transmitted to the input signal pad 7b of the TIA 7 through the second wire 17b. The TIA 7 converts the current signal into a voltage signal.

A numerical example of the optical receiver 1A is shown below.

Length of the wires 17b, 17d and 17e: 0.2 mm

Thickness of the base member 5: same as a thickness of the TIA 7, 0.15 mm to 0.25 mm Capacitance value of the capacitor 11: 330 pF In the above-described optical receiver 1A, when the signal light is incident into the photodetector 9, the photodetector 9 outputs a current signal having a magnitude corresponding to an amount of light thereof. The current signal is input to the input signal pad 7b of the TIA 7 from the anode electrode of the photodetector 9 through the first wiring pattern 5a on the base member 5 and the second wire 17b. The TIA 7 converts the input current signal into a voltage signal. The voltage signal is output from the output signal pad 7a of the TIA 7, passes through the first wire 17a and the signal line 13 and is provided to the outside of the optical receiver 1A or other electronic components inside the optical receiver 1A.

Effects obtained by the optical receiver 1A of the embodiment described above will be described. As described above, when the parasitic capacitance between the wiring pattern on the base member and the conductor under the base member is large, a resonance frequency is present in a frequency band of the current signal, and a non-transmission band of a signal component is generated. Thus, there is a risk of deterioration of communication quality such as deterioration of a signal waveform and a crosstalk between channels.

On the other hand, in the optical receiver 1A of the embodiment, the first wiring pattern 5a and the second wiring pattern 5b are separated from the grounding pattern 15 in the plan view in the normal direction of the surface 3a of the printed circuit board 3. Therefore, since the first wiring pattern 5a and the second wiring pattern 5b do not face the grounding pattern 15, the parasitic capacitance generated in the first wiring pattern 5a and the second wiring pattern 5b can be reduced. Therefore, the resonance frequency can be increased, that is, a resonance point can be increased, and thus the non-transmission band due to resonance can be moved to a higher frequency side than the frequency band of the current signal. Therefore, it is possible to curb the deterioration of communication quality such as deterioration of a signal waveform and a crosstalk between channels.

Figure 11A:
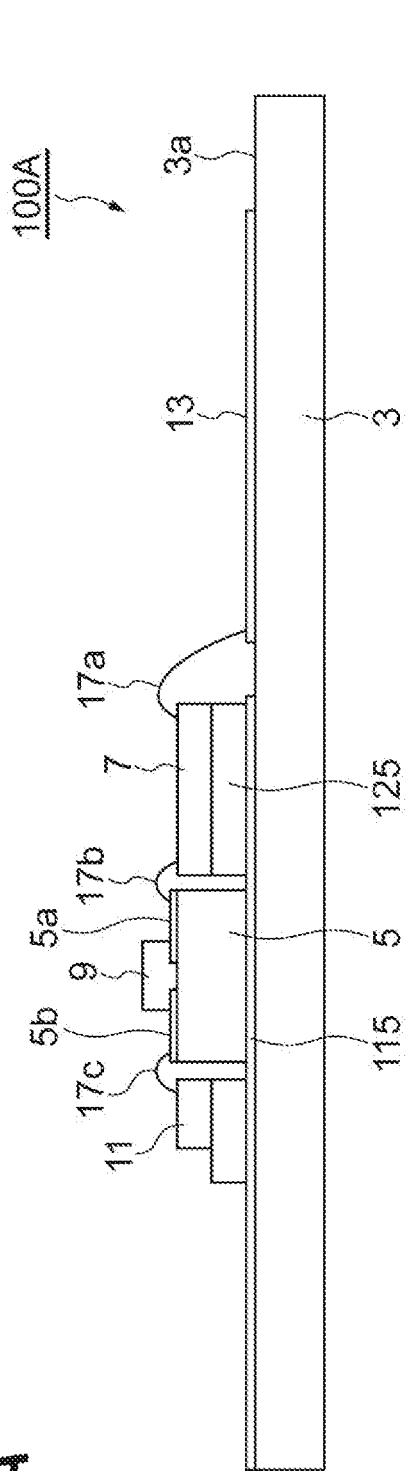
FIG. 11A is a diagram schematically showing a configuration of an optical receiver according to a comparative example.
Figure 11B:
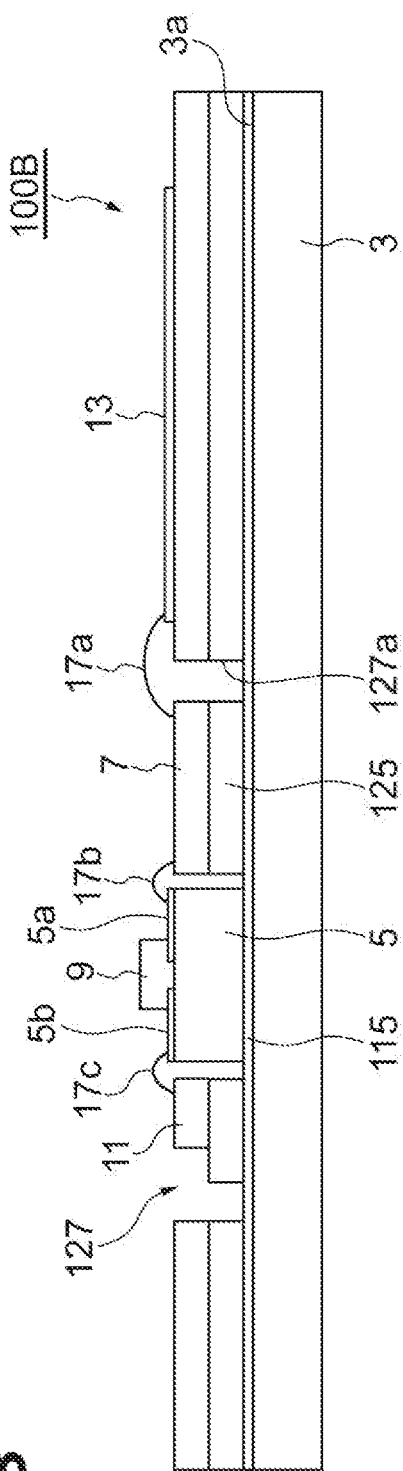
FIG. 11B is a diagram schematically showing a configuration of an optical receiver according to a comparative example.

Here, FIG. 11A and FIG. 11B are diagrams schematically showing configurations of optical receivers 100A and 100B according to a comparative example. As shown in FIG. 11A, when the grounding pattern 115 is provided at a position where faces the first wiring pattern 5a and the second wiring pattern 5b, it is necessary to thicken the base member 5 to reduce the parasitic capacitance generated between the first wiring pattern 5a and the grounding pattern 115 and between the second wiring pattern 5b and the grounding pattern 115. In this case, a thickness of the base member 5 is 0.4 mm, for example. However, in this case, a height difference between the first wiring pattern 5a on the base member 5 and the signal line 13 on the printed circuit board 3 becomes large, and it is necessary to lengthen either the first wire 17a or the second wire 17b. For example, in the case in which a high speed signal transmission such as 53 GBaud PAM4 is performed, the inductance increases when the second wire 17b becomes long, and thus a reduction in resonance frequency and deterioration in transmission characteristics are caused. Therefore, when the base member 125 is provided between the TIA 7 and the printed circuit board 3 to shorten the second wire 17b, the first wire 17a may become excessively long, impedance mismatch may occur between the TIA 7 and the signal line 13, and a transmission waveform may deteriorate.

As shown in FIG. 11B, in order to make a height of the signal line 13 equal to a height of the output signal pad 7a of the TIA 7, it is also conceivable to provide the printed circuit board 3 with a cavity 127 and to dispose the capacitor 11, the base members 5 and 125, and the TIA 7 in the cavity 127. However, since a distance between a side surface 127a of the cavity 127 and the TIA 7 is unavoidably large due to processing accuracy of the cavity 127 and the like, and it is necessary to form the signal line 13 at a certain distance from the side surface 127a of the cavity 127, it is difficult to realize a desired length of the first wire 17a. In FIG. 11B, the grounding pattern 115 is provided not on the surface of the printed circuit board 3 but on an inner layer thereof, that is, a bottom surface of the cavity 127.

In response to the above-described problem, in the optical receiver 1A of the embodiment, since the first wiring pattern 5a and the second wiring pattern 5b are separated from the grounding pattern 15 in the plan view in the normal direction of the surface 3a of the printed circuit board 3, it is not necessary to make the base member 5 thick in consideration of the parasitic capacitance. Therefore, the base member 5 can be thinned, that is, a height of the surface 51a of the base member 5 with respect to the printed circuit board 3 can be reduced. Thus, the height difference between the first wiring pattern 5a on the base member 5 and the signal line 13 on the printed circuit board 3 becomes small, and a length obtained by adding the first wire 17a and the second wire 17b can be shortened. In particular, when a height of the first wiring pattern 5a on the base member 5 and a height of the input signal pad 7b on the upper surface 7g of the TIA 7 are the same, the length of the first wire 17a can be shortened. Therefore, the second wire 17b can be shortened, and it is possible to reduce the inductance, to realize a high resonance point and to curb the deterioration of the transmission characteristics. Furthermore, the first wire 17a can be brought close to a desired length to realize impedance matching between the TIA 7 and the signal line 13, and the deterioration of the transmission waveform can be curbed.

Figure 5:
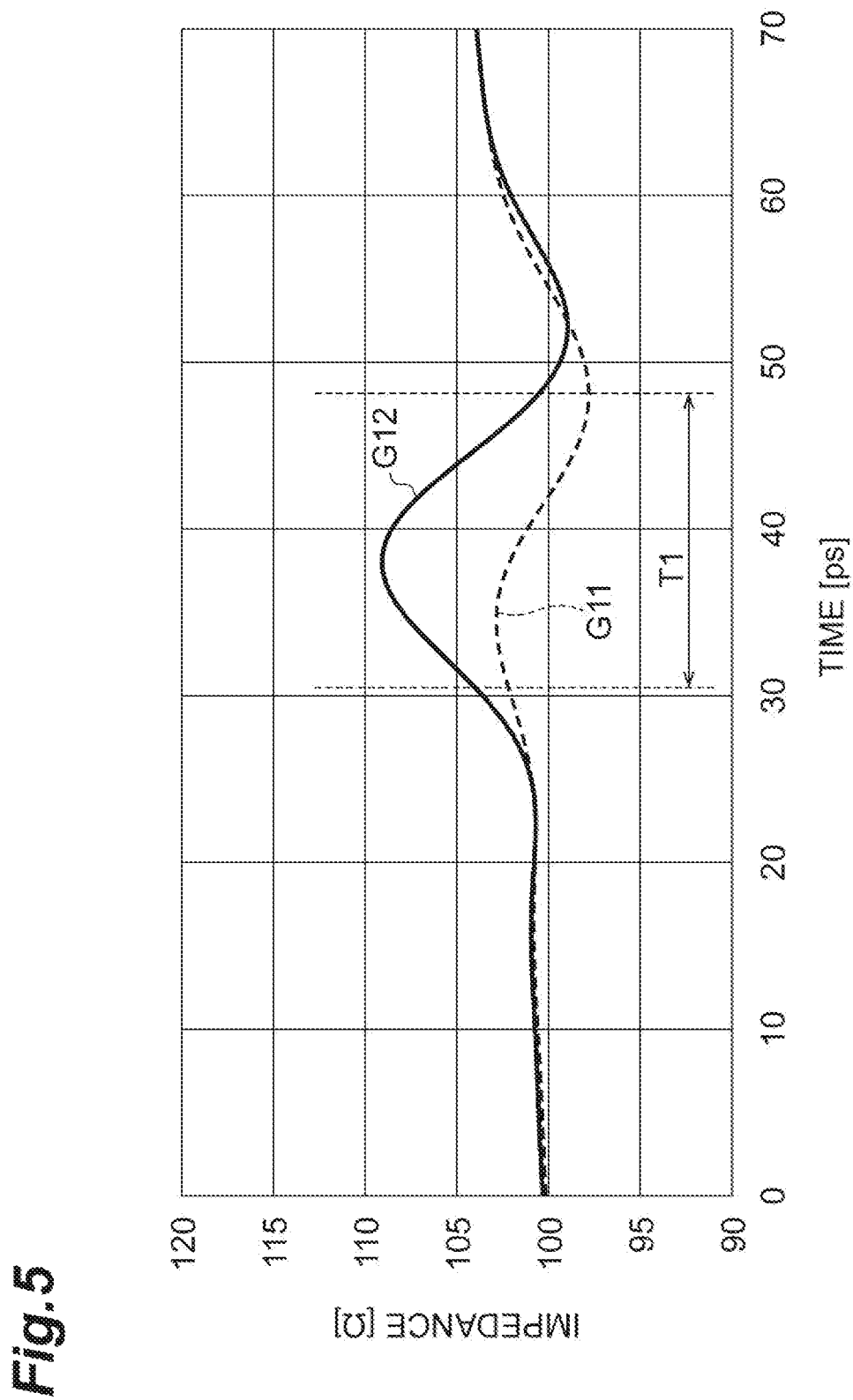
FIG. 5 is a graph showing an impedance calculation result of a TDR.

FIG. 5 is a graph showing an impedance calculation result by time domain reflectance (TDR). A period T1 in the drawing is a portion caused by the first wire 17a. In the drawing, a graph G11 shows a case in which a thickness of the TIA is 150 µm in the embodiment. A graph G12 shows a case in which the thickness of the TIA is 150 µm and a thickness of the base member 125 is 250 µm in the comparative example shown in FIG. 11A. Referring to the graph G12, when the thickness of the base member 125 is added to the thickness of the TIA 7, the impedance of the first wire 17a and a pad portion of the signal line 13, that is, a wire connection portion of an output of the TIA 7 increases by about +10Ω with respect to 100Ω.
On the other hand, when only the thickness of the TIA 7 is used, the impedance of the wire connection portion of the output of the TIA 7 can be curbed within ±5Ω with respect to 100Ω. In this way, according to the embodiment, the impedance of the wire connection portion of the output of the TIA 7 can be brought close to a desired value.

Figure 6A:
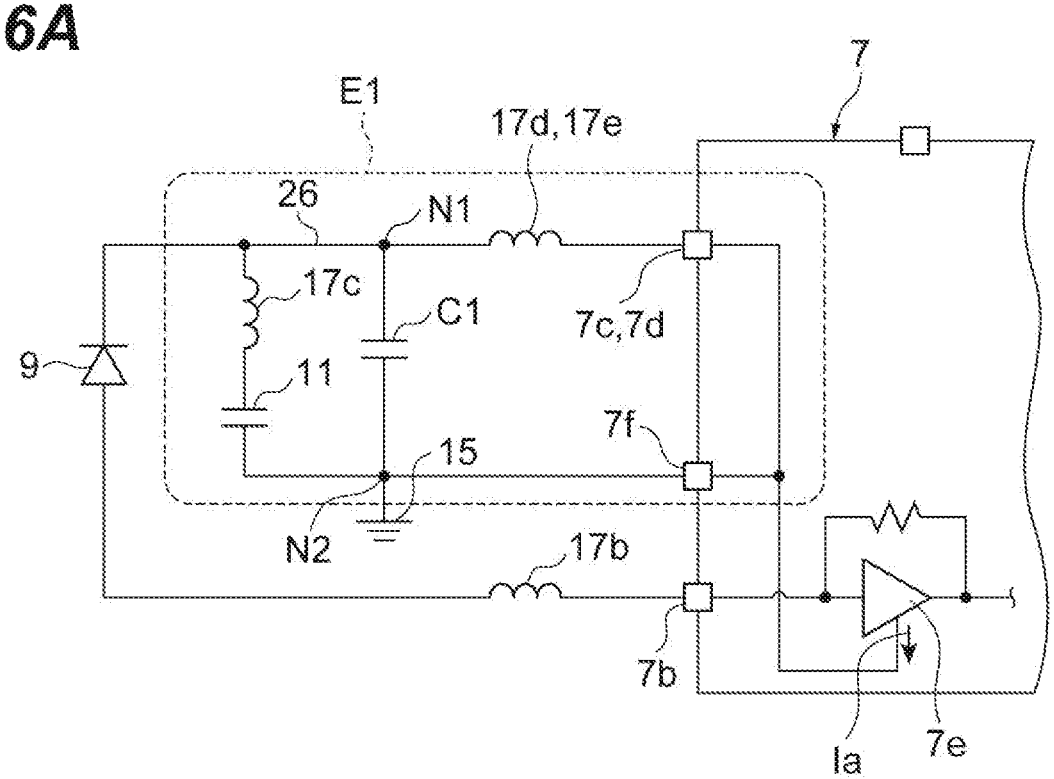
FIG. 6A is an equivalent circuit diagram of the optical receiver.

In the embodiment, the third wire 17c and the capacitor 11 are connected in series between the cathode electrode of the photodetector 9 and the grounding pattern 15. FIG. 6A is an equivalent circuit diagram of the optical receiver 1A of the embodiment. As shown in FIG. 6A, in the optical receiver 1A of the embodiment, the cathode of the photodetector 9 is connected to the bias pads 7c and 7d of the TIA 7 through the wires 17d and 17e. In the drawing, the wires 17d and 17e are shown as inductances. The anode of the photodetector 9 is connected to an amplifier circuit 7e of the TIA 7 through the second wire 17b and the input signal pad 7b of the TIA 7. A GND pad 7f of the TIA 7 is connected to the grounding pattern 15. In the drawing, the grounding pattern 15 is shown as a reference potential line, that is, a GND line. Additionally, a parasitic capacitance C1 is present in the conductive film 26 between the photodetector 9 and the wires 17d and 17e. The third wire 17c and the capacitor 11 connected in series to each other are connected in parallel with the parasitic capacitance C1 between the conductive film 26 and the grounding pattern 15.

Figure 6B:
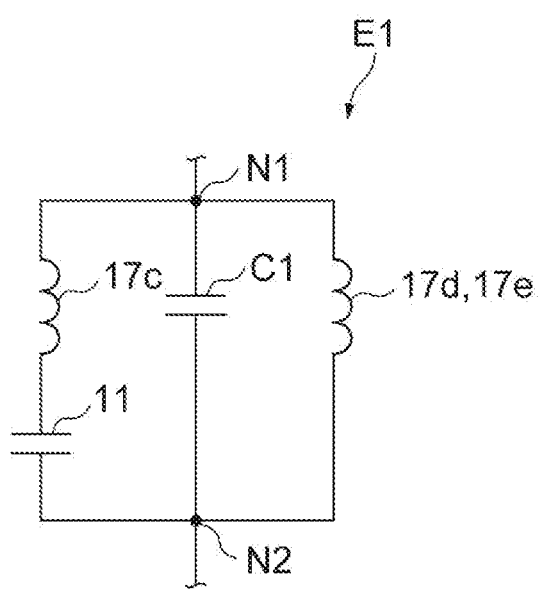
FIG. 6B is an equivalent circuit diagram in which only a circuit portion of FIG. 6A is extracted.

FIG. 6B is an equivalent circuit diagram in which only a circuit portion E1 of FIG. 6A is extracted. As shown in the drawing, the circuit portion E1 has a configuration in which a series circuit including the third wire 17c and the capacitor 11, the parasitic capacitance C1, and a combined inductance of the wires 17d and 17e are connected in parallel with each other between a node N1 and a node N2. The node N1 is connected to the cathode of the photodetector 9, and the node N2 is connected to the grounding pattern 15.

Figure 7A:
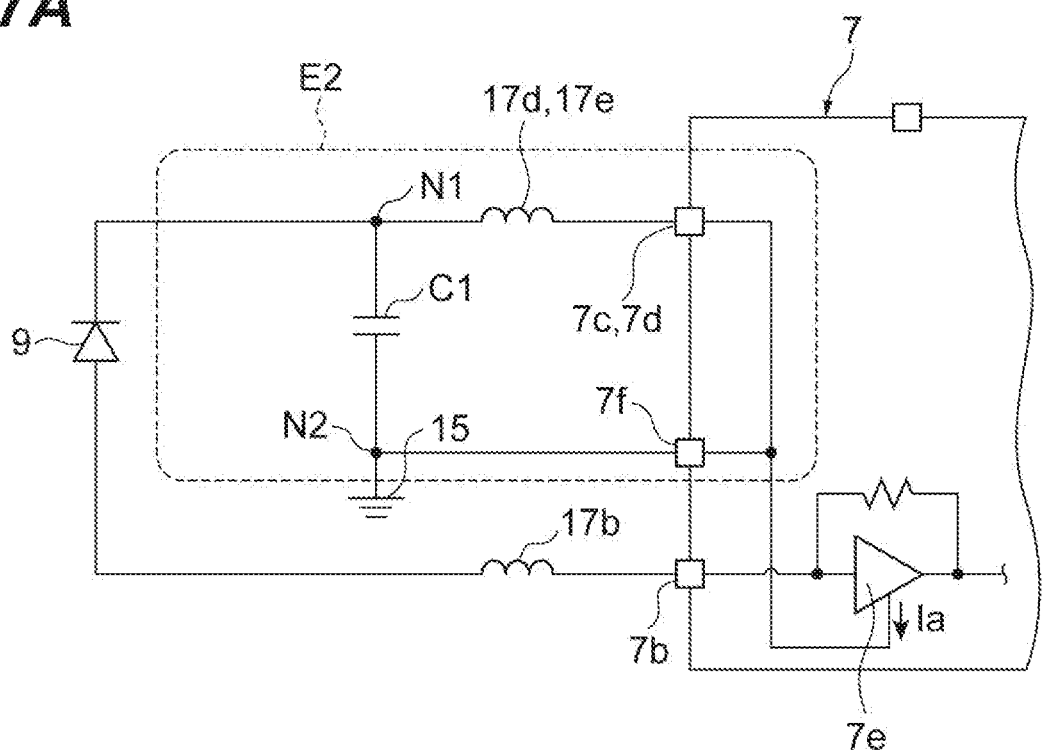
FIG. 7A is an equivalent circuit diagram of an optical receiver according to a comparative example.
Figure 7B:
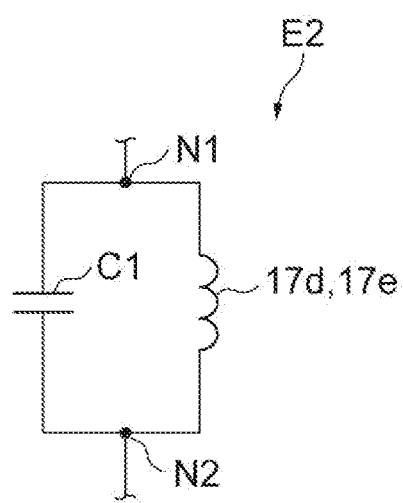
FIG. 7B is an equivalent circuit diagram in which only a circuit portion of FIG. 7A is extracted.

On the other hand, FIG. 7A is an equivalent circuit diagram of an optical receiver according to a comparative example. A difference between the comparative example and the optical receiver 1A of the embodiment shown in FIG. 6A is that the series circuit including the third wire 17c and the capacitor 11 is not provided. Therefore, when only a circuit portion E2 of FIG. 7A is extracted, as shown in FIG. 7B, the circuit portion E2 has a circuit configuration in which the parasitic capacitance C1 and the combined inductance of the wires 17d and 17e are connected in parallel with each other between the node N1 and the node N2.

Each of the circuit portions E1 and E2 forms an LC resonance circuit. Then, when a resonance frequency of the LC resonance circuit approaches the signal frequency, a return current Ia from the amplifier circuit 7e of the TIA 7 to the photodetector 9 decreases. At this time, a flow of the current signal from the photodetector 9 to the amplifier circuit 7e is blocked, and the signal is not transmitted. Here, assuming that the capacitance value of the parasitic capacitance C1 is $C_t$ and the combined inductance of the wires 17d and 17e is $L_{wire}$, admittance of the LC resonant circuit of the comparative example shown in FIG. 7B is

[Equation 1]

$$Y = \frac{1}{j\omega L_{wire}} + j\omega C_t \qquad (1)$$
$$= \frac{1 - \omega^2 L_{wire} C_t}{j\omega L_{wire}}$$

and Y=0, that is, the resonance frequency is

[Equation 2]

$$f = \frac{1}{2\pi}\sqrt{\frac{1}{L_{wire}C_t}} \qquad (2)$$

On the other hand, in the LC resonant circuit of the embodiment shown in FIG. 6B, since the capacitance value of the capacitor 11 is sufficiently large, it is considered that the capacitor 11 is short-circuited to a high frequency, and the inductance of the third wire 17c is $L_b$, admittance thereof is

[Equation 3]

$$Y = \frac{1}{j\omega L_{wire}} + j\omega C_t + \frac{1}{j\omega L_b} \qquad (3)$$
$$= \frac{L_{wire} + L_b - \omega^2 L_{wire} L_b C_t}{j\omega L_{wire} L_b}$$

and Y=0, that is, the resonance frequency is

[Equation 4]

$$f = \frac{1}{2\pi}\sqrt{\frac{L_{wire} + L_b}{L_{wire}L_b C_t}} \qquad (4)$$

When the inductance $L_b$ is sufficiently smaller than the inductance $L_{wire}$, the above-described Equation 4 is

[Equation 5]

$$f = \frac{1}{2\pi}\sqrt{\frac{L_{wire}}{L_{wire}L_bC_t}} = \frac{1}{2\pi}\sqrt{\frac{1}{L_bC_t}} \qquad (5)$$

That is, in the LC resonance circuit of the comparative example, the inductance $L_{wire}$ mainly affects the resonance frequency f as shown in Equation (2), but in the LC resonance circuit of the embodiment, the inductance $L_b$ mainly affects the resonance frequency f. As described above, since the inductance $L_b$ is smaller than the inductance $L_{wire}$, the resonance frequency f of the embodiment is higher than the resonance frequency f of the comparative example. In this way, according to the optical receiver 1A of the embodiment, since the resonance frequency of the LC resonance circuit including the parasitic capacitance C1 and the wires 17d and 17e can be increased, the non-transmission band of the signal due to the resonance can be moved to a higher frequency side. Therefore, it is possible to further curb the deterioration of communication quality such as deterioration of a signal waveform and a crosstalk between channels.

In a current optical communication system, 100 G transmission is becoming mainstream in a branch line system and a data center and between the branch line system and the data center, and further high speed such as 400 G transmission is planned in the future. At this transmission speed, a transmission clock frequency is, for example, 25 GHz to 56 GHz. On the other hand, in the embodiment, even when the resonance frequency f exceeds 60 GHz, and even in such a transmission clock frequency, resonance within a frequency band of the current signal can be avoided.

As in the embodiment, the resistor 31 may be interposed between the cathode of the photodetector 9 and the third wire 17c, for example, between the portion of the conductive film 26 connected to the cathode of the photodetector 9 and the second wiring pattern 5b. The LC resonance is effectively suppressed by the damping action of the electric resistance of the resistor 31.

In the embodiment, the second region 15b of the grounding pattern 15 to which the other electrode 11b of the capacitor 11 is connected and the first region 15a of the grounding pattern 15 on which the TIA 7 is mounted are electrically connected to each other through a wiring provided at at least one of the surface 3a of the printed circuit board 3 and the inside of the printed circuit board 3. Therefore, it is possible to stabilize potentials of the first region 15a and the second region 15b of the grounding pattern 15 while an increase in the parasitic capacitance of the first wiring pattern 5a and the second wiring pattern 5b is curbed.

As in the embodiment, the grounding pattern 15 may include a third region 15c which passes through a lateral side of the base member 5 and electrically connects the first region 15a and the second region 15b to each other. For example, with such a configuration, the first region 15a and the second region 15b of the grounding pattern 15 can be electrically connected to each other through the wiring provided on the surface 3a of the printed circuit board 3.

First Modified Example

Figure 8:
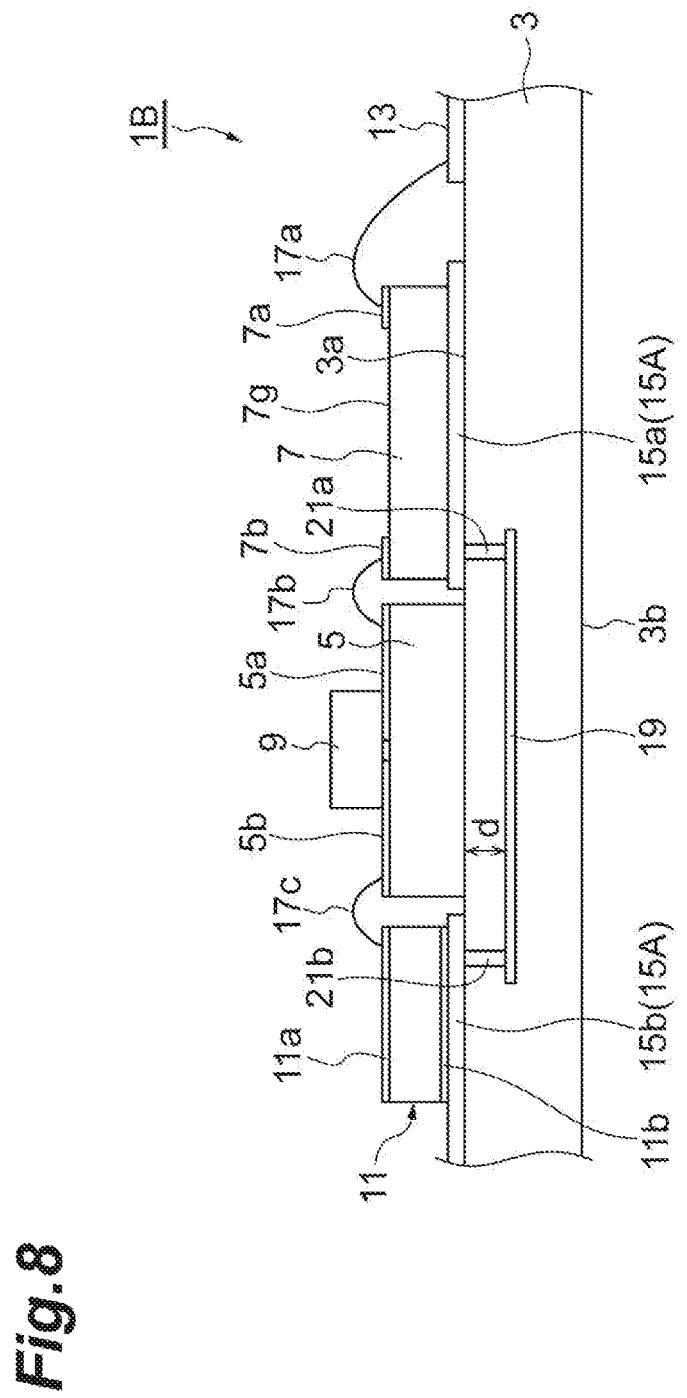
FIG. 8 is a diagram schematically showing a cross-sectional structure of an optical receiver according to a modified example.

FIG. 8 is a diagram schematically showing a cross-sectional configuration of an optical receiver 1B according to a modified example of the above-described embodiment. A grounding pattern 15A of the modified example includes the same first region 15a and second region 15b as in the above-described embodiment but does not include the third region 15c. That is, the first region 15a and the second region 15b are separated from each other on the surface 3a of the printed circuit board 3. Instead, as shown in FIG. 8, the optical receiver 1B of the modified example includes a grounding pattern 19, a first via 21a, and a second via 21b. Additionally, the first region 15a is electrically connected to the second region 15b through the grounding pattern 19, the first via 21a and the second via 21b. The grounding pattern 19 is an example of a fourth grounding pattern in the present disclosure.

The grounding pattern 19 is a metal wiring layer provided at at least one of the inside of the wiring substrate 3 and the back surface 3b thereof and extends parallel to the surface 3a in the first direction D1 and the second direction D2 shown in FIG. 2. Here, the fact that the metal wiring layer is provided inside the printed circuit board 3 means that it is provided between the surface 3a and the back surface 3b of the printed circuit board 3, is not exposed on both the surface 3a and the back surface 3b and includes a case in which it is exposed from a side surface of the printed circuit board 3.

The grounding pattern 19 can be formed between the multiple insulating layers which form the printed circuit board 3. A constituent material of the grounding pattern 19 is Au or Cu, for example. The grounding pattern 19 may have a region which overlaps the base member 5 in the plan view in the thickness direction of the printed circuit board 3, that is, the normal direction of the surface 3a. In that case, a parasitic capacitance may occur between the first wiring pattern 5a and the corresponding region of the grounding pattern 19 and between the second wiring pattern 5b and the corresponding region of the grounding pattern 19. A magnitude of the parasitic capacitance is mainly determined by a thickness of the base member 5 and a distance d from the surface 3a to the grounding pattern 19, that is, a formation depth of the grounding pattern 19. Although the parasitic capacitance may cause a non-transmission band due to the resonance, the distance d is set so that the non-transmission band is higher than a desired signal frequency. When the distance d is increased, the value of the parasitic capacitance becomes relatively small accordingly, and the resonance frequency f becomes higher. Therefore, the grounding pattern 19 may be provided on the back surface 3b to increase the distance d as much as possible.

Specifically, assuming that a relative permittivity of the base member 5 is $\varepsilon_{rc}$, a relative permittivity of the insulating layer of the printed circuit board 3 is $\varepsilon_{rs}$, and a decrease amount of the thickness of the base member 5 with respect to the comparative example of FIG. 11A is $t_c$, the distance d is set to satisfy $d \geq (\varepsilon_{rs}/\varepsilon_{rc}) \cdot t_c$. For example, the relative permittivity of the base member 5 is $\varepsilon_{rc}=3$ 0.4 when the insulating body 51 of the base member 5 is formed of quartz, and the relative permittivity of the insulating layer of the printed circuit board 3 is $\varepsilon_{rs}=4.5$ when the insulating layer of the printed circuit board 3 is formed of FR4. Therefore, assuming that the decrease amount of the thickness of the base member 5 is $t_c=0.25$ mm, the distance d should be $d=(4.5/3.4)\times 0.25$ mm$=0.33$ mm.

The first via 21a is a conductor which passes through the insulating layer between the grounding pattern 19 and the first region 15a. One end of the first via 21a is in contact with the grounding pattern 19, and the other end thereof is in contact with the first region 15a. Therefore, the first via 21a electrically connects the grounding pattern 19 to the first region 15a. The second via 21b is a conductor which passes through the insulating layer between the grounding pattern 19 and the second region 15b. One end of the second via 21b is in contact with the grounding pattern 19, and the other end thereof is in contact with the second region 15b. Therefore, the second via 21b electrically connects the grounding pattern 19 to the second region 15b.

According to the configuration of the modified example, the first region 15a and the second region 15b of the grounding pattern 15 can be electrically connected to each other through a wiring provided inside the printed circuit board 3. Therefore, it is possible to stabilize potentials of the first region 15a and the second region 15b of the grounding pattern 15 while an increase in the parasitic capacitance of the first wiring pattern 5a and the second wiring pattern 5b is curbed.

Second Modified Example

Figure 9:
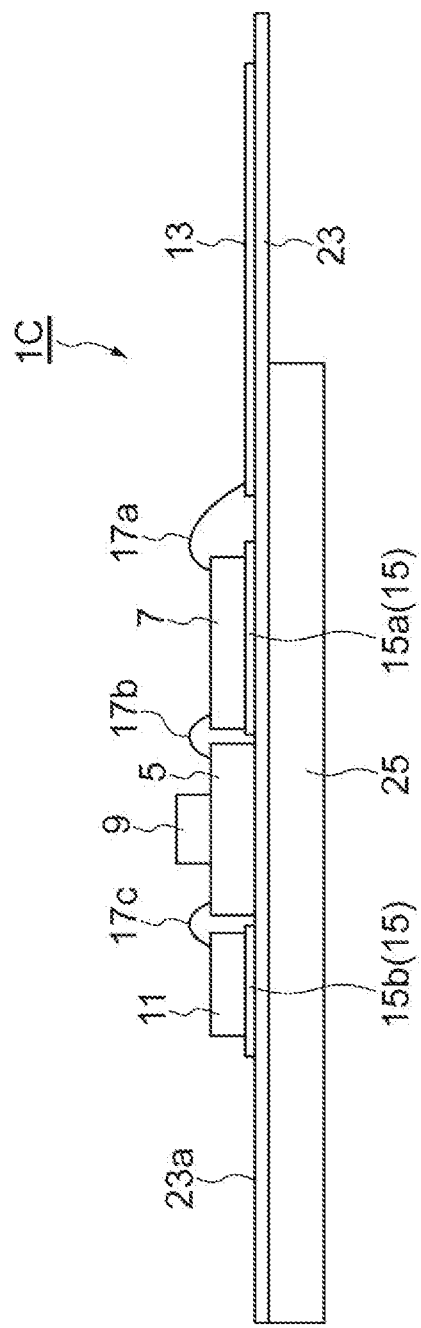
FIG. 9 is a diagram schematically showing a cross-sectional structure of an optical receiver according to another modified example.
Figure 10:
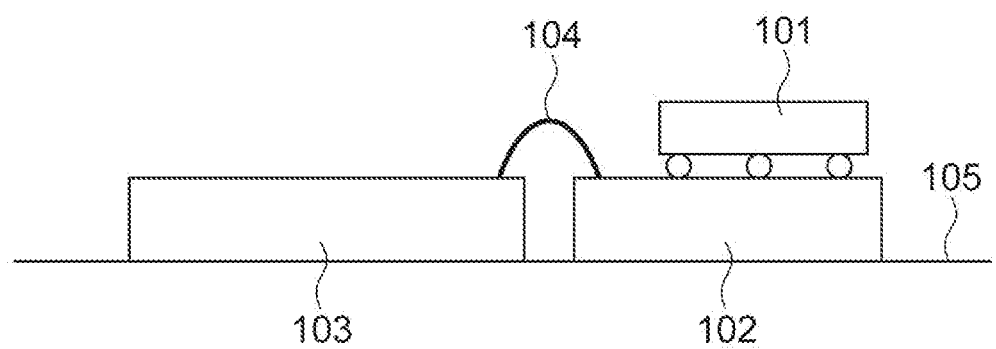
FIG. 10 is a diagram schematically showing a configuration of a conventional optical receiver.

FIG. 9 is a diagram schematically showing a cross-sectional configuration of an optical receiver 1C according to another modified example of the above-described embodiment. The optical receiver 1C of the modified example includes a flexible printed circuit (FPC) 23 and a reinforcing plate 25, instead of the wiring substrate 3 of the above-described embodiment. A configuration of the FPC 23 is the same as that of the printed circuit board 3 of the above-described embodiment, except that the FPC 23 is thinner and more flexible than the rigid printed circuit board. That is, the FPC 23 has a flat surface 23a, and the signal line 13 and the grounding pattern 15 are formed on the surface 23a. The base member 5 is disposed on the surface 23a, the TIA 7 is mounted on the first region 15a of the grounding pattern 15, and the N capacitors 11 are mounted on the second region 15b of the grounding pattern 15. Other configurations are the same as the other configurations on the surface 3a of the above-described embodiment.

A reinforcing plate 25 is provided on the back surface side of the FPC 23 and is bonded to the back surface of the FPC 23 to structurally support the FPC 23. A structure on the surface 23a is located on the reinforcing plate 25 except for an end portion of the signal line 13 on the side opposite to the TIA 7. The reinforcing plate 25 is formed of a rigid material such as FR4.

As in the modified example, the printed circuit board may have flexibility. Even in this case, it is possible to preferably obtain the same effects as those of the above-described embodiment.

The optical receiver according to the present invention is not limited to the above-described embodiment and each of the modified examples, and various modifications can be made. For example, in the above-described embodiment and the first modified example, although the first region and the second region are connected to each other through one of the third region on the surface of the printed circuit board and the wiring layer provided inside the printed circuit board, the first region and the second region may be connected to each other through both the wiring on the surface of the printed circuit board and the internal wiring.

In the above-described embodiment, although a capacity element is exemplified by a capacitor such as a chip capacitor, the capacitor may be constituted by the parasitic capacitance between the wiring pattern and the grounding pattern 15 or may be a thin silicon capacitor.

What is claimed is:

1. An optical receiver comprising:
   a circuit board having a first side, a second side opposite to the first side, a first grounding pattern, a second grounding pattern, and a signal line, the first grounding pattern and the second grounding pattern being formed on the first side separately from each other, the signal line being formed on the first side;
   a base member having an insulating body, a first wiring pattern, and a second wiring pattern, the first wiring pattern and the second wiring pattern being formed on a third side of the insulating body, the base member being disposed between the first grounding pattern and the second grounding pattern on the first side of the circuit board;
   a photodetector having a first electrode and a second electrode, the photodetector being mounted on the third side of the base member, the first electrode being electrically connected to the first wiring pattern, the second electrode being electrically connected to the second wiring pattern;
   a transimpedance amplifier having a fourth side, a first pad, and a second pad, the first pad and the second pad being formed on the fourth side, the transimpedance amplifier being mounted on the first grounding pattern of the circuit board, the first pad being electrically connected to the signal line through a first wire, the second pad being electrically connected to the first wiring pattern through a second wire; and
   a capacitor having a third electrode and a fourth electrode, the capacitor being mounted on the second grounding pattern, the third electrode being electrically connected to the second wiring pattern, the fourth electrode being electrically connected to the second grounding pattern,
   wherein the first wiring pattern and the second wiring pattern are apart from the first grounding pattern and the second grounding pattern in a plan view of the first side of the circuit board, and
   the first grounding pattern is electrically connected to the second grounding pattern through at least one of a third grounding pattern and a fourth grounding pattern, the third grounding pattern being formed on the first side and being apart from the first wiring pattern and the second wiring pattern in the plan view of the first side, the fourth grounding pattern being formed at least in an inside of the circuit board or on the second side of the circuit board.

2. The optical receiver according to claim 1, wherein:
   the circuit board includes the fourth grounding pattern, a first via configured to pass through an insulating layer between the fourth grounding pattern and the first grounding pattern, and a second via configured to pass through an insulating layer between the fourth grounding pattern and the second grounding pattern, and
   the first grounding pattern is electrically connected to the second grounding pattern through the fourth grounding pattern, the first via and the second via.

3. The optical receiver according to claim 2, wherein the fourth grounding pattern has a region which overlaps the base member in a plan view of the first side.

4. The optical receiver according to claim 1, wherein the third grounding pattern passes laterally along the base member in a plan view of the first side and electrically connects the first grounding pattern and the second grounding pattern to each other.

5. The optical receiver according to claim 4, wherein the third grounding pattern includes a portion which extends from the first grounding pattern along one side surface of the base member and reaches the second grounding pattern in the plan view of the first side, and another portion which extends from the first grounding pattern along the other side surface of the base member and reaches the second grounding pattern in the plan view of the first side.

6. The optical receiver according to claim 5, wherein the signal line is provided on a side opposite to an opening formed by the first grounding pattern, the second grounding pattern, and the third grounding pattern with respect to the first grounding pattern in the plan view of the first side of the circuit board.

7. The optical receiver according to claim 6, wherein the opening surrounds a periphery of the base member in the plan view of the first side of the circuit board.

8. The optical receiver according to claim 1, wherein a height from the first side to the fourth side is equal to a height from the first side of the circuit board to the third side of the base member.

9. The optical receiver according to claim 1, wherein the transimpedance amplifier has a pad which serves as a reference potential on a bottom surface thereof, and the pad of the transimpedance amplifier and the first grounding pattern are conductively bonded via a conductive bonding material.

10. The optical receiver according to claim 1, wherein the capacitor is a chip capacitor.

* * * * *